US008788909B2

(12) United States Patent
Litsyn et al.

(10) Patent No.: US 8,788,909 B2
(45) Date of Patent: Jul. 22, 2014

(54) PROBABILISTIC ERROR CORRECTION IN MULTI-BIT-PER-CELL FLASH MEMORY

(75) Inventors: Simon Litsyn, Giv'at Shmuel (IL); Idan Alrod, Herzliya (IL); Eran Sharon, Richon Lezion (IL); Mark Murin, Kfar Saba (IL); Menahem Lasser, Kohav Yair (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 1046 days.

(21) Appl. No.: 12/401,756

(22) Filed: Mar. 11, 2009

(65) Prior Publication Data

US 2009/0217131 A1 Aug. 27, 2009

Related U.S. Application Data (62) Division of application No. 11/339,571, filed on Jan. 26, 2006, now Pat. No. 7,526,715.

(60) Provisional application No. 60/726,817, filed on Oct. 17, 2005.

(51) Int. Cl.
*G11C 29/00* (2006.01)
*H03M 13/00* (2006.01)

(52) U.S. Cl.
USPC ............................................ 714/773; 714/780

(58) Field of Classification Search
USPC .................................................. 714/773, 780
See application file for complete search history.

(56) References Cited

U.S. PATENT DOCUMENTS

| 4,100,403 A | * | 7/1978 | Eggenberger et al. ........ 714/765 |
| 4,305,150 A | * | 12/1981 | Richmond et al. ............ 714/709 |
| 4,450,559 A | * | 5/1984 | Bond et al. ..................... 714/6.2 |
| 4,550,414 A | | 10/1985 | Guinon et al. |
| 4,905,254 A | | 2/1990 | Bergmans |
| 5,369,651 A | * | 11/1994 | Marisetty ...................... 714/767 |
| 5,404,485 A | | 4/1995 | Ban |
| 5,434,825 A | | 7/1995 | Harari |
| 5,475,693 A | * | 12/1995 | Christopherson et al. .... 714/710 |

(Continued)

FOREIGN PATENT DOCUMENTS

| CN | 1527499 A | 9/2004 |
| CN | 1653554 A | 8/2005 |

(Continued)

OTHER PUBLICATIONS

George C. Clark, Jr. and J.B. Cain, Error Correction Coding for Digital Communications {Springer 1981}.

(Continued)

*Primary Examiner* — Joseph D Torres
(74) *Attorney, Agent, or Firm* — Alston & Bird LLP (57) ABSTRACT

Data that are stored in cells of a multi-bit-per cell memory, according to a systematic or non-systematic ECC, are read and corrected (systematic ECC) or recovered (non-systematic ECC) in accordance with estimated probabilities that one or more of the read bits are erroneous. In one method of the present invention, the estimates are a priori. In another method of the present invention, the estimates are based only on aspects of the read bits that include significances or bit pages of the read bits. In a third method of the present invention, the estimates are based only on values of the read bits. Not all the estimates are equal.

6 Claims, 4 Drawing Sheets

(56) References Cited

U.S. PATENT DOCUMENTS

| | | | |
|---|---|---|---|
| 5,699,369 A * | 12/1997 | Guha | 714/774 |
| 5,701,304 A * | 12/1997 | Glover et al. | 714/710 |
| 6,029,264 A * | 2/2000 | Kobayashi et al. | 714/755 |
| 6,069,821 A * | 5/2000 | Jun et al. | 365/185.21 |
| 6,108,811 A * | 8/2000 | Nakamura et al. | 714/795 |
| 6,161,209 A * | 12/2000 | Moher | 714/780 |
| 6,212,654 B1 * | 4/2001 | Lou et al. | 714/701 |
| 6,522,580 B2 | 2/2003 | Chen | |
| 6,552,932 B1 * | 4/2003 | Cernea | 365/185.05 |
| 6,604,220 B1 * | 8/2003 | Lee | 714/769 |
| 6,625,236 B1 * | 9/2003 | Dent et al. | 375/341 |
| 6,631,492 B2 * | 10/2003 | Marchant | 714/764 |
| 6,643,188 B2 | 11/2003 | Tanaka | |
| 6,691,263 B2 | 2/2004 | Vasic et al. | |
| 6,836,432 B1 * | 12/2004 | Parker et al. | 365/185.03 |
| 6,990,622 B2 | 1/2006 | Davis et al. | |
| 7,023,735 B2 | 4/2006 | Ban | |
| 7,047,477 B2 * | 5/2006 | Tolhuizen et al. | 714/768 |
| 7,180,968 B2 * | 2/2007 | Miyauchi et al. | 375/341 |
| 7,234,096 B2 * | 6/2007 | Yamada | 714/755 |
| 7,310,347 B2 | 12/2007 | Lasser | |
| 7,372,731 B2 | 5/2008 | Ban | |
| 7,430,693 B2 | 9/2008 | Noguchi et al. | |
| 7,493,457 B2 | 2/2009 | Murin | |
| 7,526,715 B2 | 4/2009 | Litsyn et al. | |
| 2002/0048202 A1 | 4/2002 | Higuchi | |
| 2003/0115539 A1 | 6/2003 | Giese et al. | |
| 2003/0217323 A1 | 11/2003 | Guterman et al. | |
| 2004/0225947 A1 | 11/2004 | Guterman et al. | |
| 2005/0013171 A1 | 1/2005 | Ban et al. | |
| 2005/0201401 A1 | 9/2005 | Lasser | |
| 2005/0213393 A1 | 9/2005 | Lasser | |
| 2006/0101193 A1 | 5/2006 | Murin | |
| 2007/0089034 A1 | 4/2007 | Litsyn | |

FOREIGN PATENT DOCUMENTS

| | | |
|---|---|---|
| EP | 1 379 001 A2 | 1/2004 |
| JP | 09230273 | 3/1999 |
| JP | 10252064 | 6/1999 |
| JP | 10144127 | 8/1999 |
| JP | 10053523 | 9/1999 |
| JP | 2000148592 | 11/2001 |
| JP | 2002045116 | 2/2003 |
| JP | 2003308163 | 3/2005 |

OTHER PUBLICATIONS

S. Lin and D.J. Costello, Error Control Coding: Fundamental and Applications (Prentice Hall 1983).
Branka Vucetic and Jinhong Yuan, Turbo Codes: Principles and Applications (Kluwer 2000).
Office Action for U.S. Appl. No. 12/401,629 dated May 3, 2012.
Office Action for U.S. Appl. No. 12/401,630 dated May 4, 2012.
International Preliminary Report on Patentability and Written Opinion for International Application No. PCT/IL06/001175, mailed Mar. 10, 2009.
First Office Action for Chinese Patent Application No. 200680044045.2, dated May 27, 2011.
Extended European Search Report for European Patent Application No. 06 809 752.6, dated Oct. 22, 2009.
Notification of Reasons for Rejection for Japanese Patent Application No. 2008-535184, dated May 6, 2011.
Notice of Grounds for Rejection for Korean Patent Application No. 10-2008-7010944, dated Aug. 20, 2009.
Office Action for Israeli Patent Application No. 196239, dated Apr. 22, 2012.
Office Action for U.S. Appl. No. 12/401,760 dated Jun. 27, 2012.
Ardakani, M. et al., *A More Accurate One-Dimensional Analysis and Design of Irregular LDPC Codes*, IEEE Transactions on Communications, vol. 52, No. 12, (Dec. 2004) 2106-2114.
Sharon, Et et al., *Exit Functions for Binary Input Memoryless Symmetric Channels*, Proc. of Int. Symp. On info. Theory (ISIT) 2004, Chicago Illinois 9.441, Jun. 27-Jul. 2, 2004, 6 pages.
Sharon, E. et al., *Exit Functions for the Gaussian Channel*, 40$^{th}$ Annual Allerton Conf. on Communication, Control, Computers, Allerton, IL, Oct. 2003, 472-981, pp. 1-6.
Fossorier, M. P. C.; "*Reliability-Based Soft-Decision Decoding Algorithms for Linear Block Codes*;" Chapter 10; Sandisk IL LTD; pp. 395-402; retrieved on Aug. 20, 2013.
"*DiskOnChip® Millennium Plus 13/32/64MByte: Data Sheet*;" M-Systems: Flash Disk Pioneers; retrieved on Aug. 20, 2013 from <www.kip.uni-heidelberg.de/DCS . . . /DOC_Millennium_Plus_DS_Rev1.7.pdf>.
Office Action for Chinese Application No. 200680044045.2; dated Feb. 27, 2012.
Office Action for Chinese Application No. 200680044045.2; dated Dec. 26, 2012.
Office Action for U.S. Appl. No. 12/401,630; dated Dec. 23, 2013.
Office Action for U.S. Appl. No. 12/401,760; dated Dec. 6, 2013.

* cited by examiner

PROBABILISTIC ERROR CORRECTION IN MULTI-BIT-PER-CELL FLASH MEMORY

This patent application is a Divisional of U.S. patent application Ser. No. 11/339,571, filed on Jan. 26, 2006, now U.S. Pat. No. 7,526,715 which claims priority under 37 U.S.C. §119(e) from U.S. Provisional Application No. 60/726,817, filed on Oct. 17, 2005.

FIELD AND BACKGROUND OF THE INVENTION

The present invention relates to error correction of digital data and, more particularly, to a method of error correction for flash memory devices that store multiple bits per cell.

Flash memory devices have been known for many years. Typically, each cell within a flash memory stores one bit of information. Traditionally, the way to store a bit has been by supporting two states of the cell—one state represents a logical "0" and the other state represents a logical "1". In a flash memory cell the two states are implemented by having a floating gate above the cell's channel (the area connecting the source and drain elements of the cell's transistor), and having two valid states for the amount of charge stored within this floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. Now it is possible to read the stored bit by checking the threshold voltage of the cell: if the threshold voltage is in the higher state then the bit value is "0" and if the threshold voltage is in the lower state then the bit value is "1". Actually there is no need to accurately read the cell's threshold voltage. All that is needed is to correctly identify in which of the two states the cell is currently located. For that purpose it is enough to make a comparison against a reference voltage value that is in the middle between the two states, and thus to determine if the cell's threshold voltage is below or above this reference value.

Figure 1A:
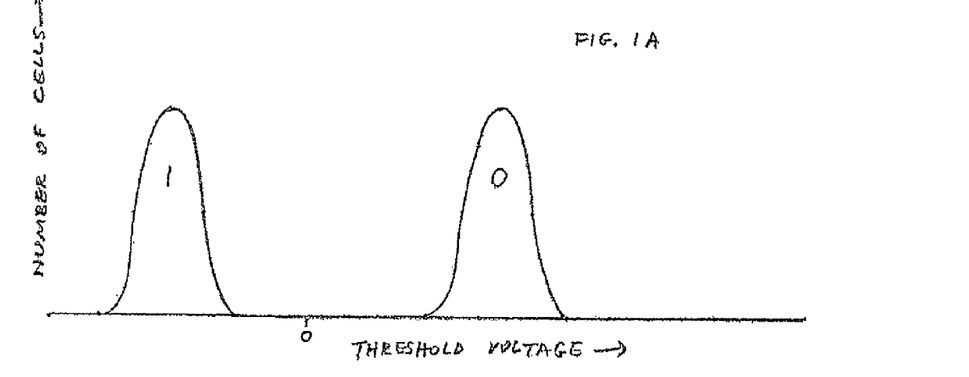
FIGS. 1A-1D show threshold voltage distributions in a one-bit flash cell, a two-bit flash cell, a three-bit flash cell and a four-bit flash cell.

FIG. 1A shows graphically how this works. Specifically, FIG. 1A shows the distribution of the threshold voltages of a large population of cells. Because the cells in a flash memory are not exactly identical in their characteristics and behavior (due, for example, to small variations in impurities concentrations or to defects in the silicon structure), applying the same programming operation to all the cells does not cause all of the cells to have exactly the same threshold voltage. (Note that, for historical reasons, writing data to a flash memory is commonly referred to as "programing" the flash memory.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

Figure 1B:
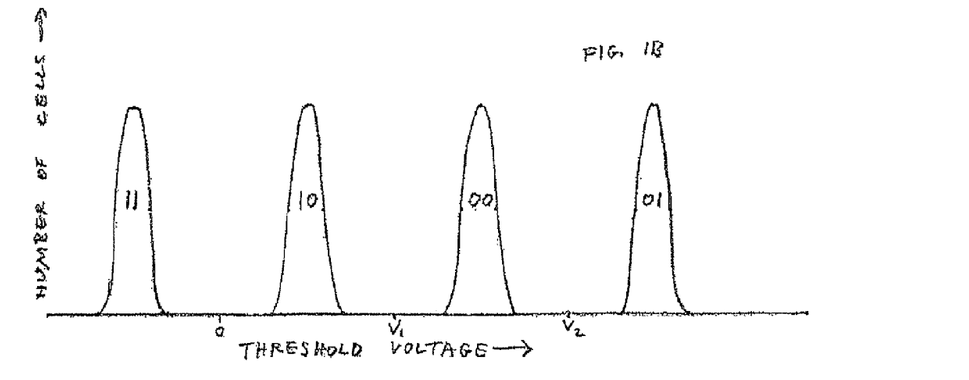

In recent years a new kind of flash memory has appeared on the market, using a technique conventionally called "Multi Level Cells" or MLC for short. (This nomenclature is misleading, because the previous type of flash cells also have more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two or more bits in each cell. In order for a single cell to store two bits of information the cell must be able to be in one of four different states. As the cell's "state" is represented by its threshold voltage, it is clear that a 2-bit MBC cell should support four different valid ranges for its threshold voltage. FIG. 1B shows the threshold voltage distribution for a typical 2-bit MBC cell. As expected, FIG. 1B has four peaks, each corresponding to one state. As for the SBC case, each state is actually a range and not a single number. When reading the cell's contents, all that must be guaranteed is that the range that the cell's threshold voltage is in is correctly identified. For a prior art example of an MBC flash memory see U.S. Pat. No. 5,434,825 to Harari.

Figure 1C:
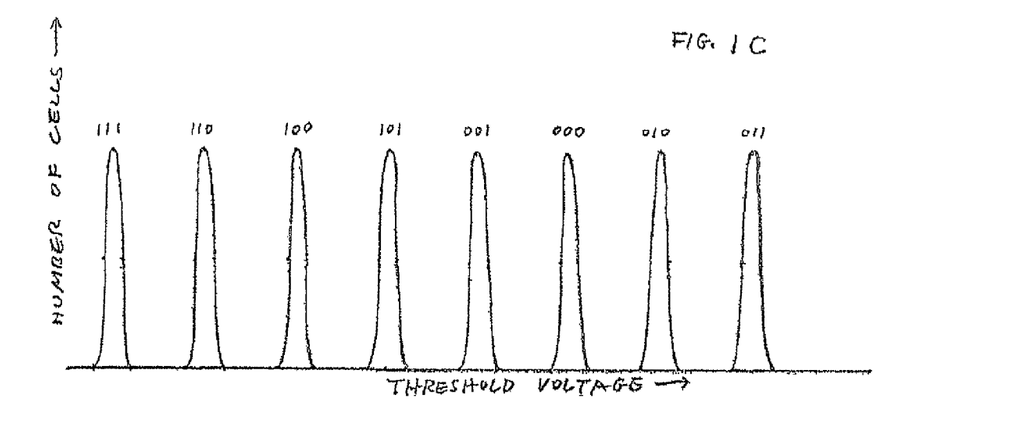
Figure 1D:
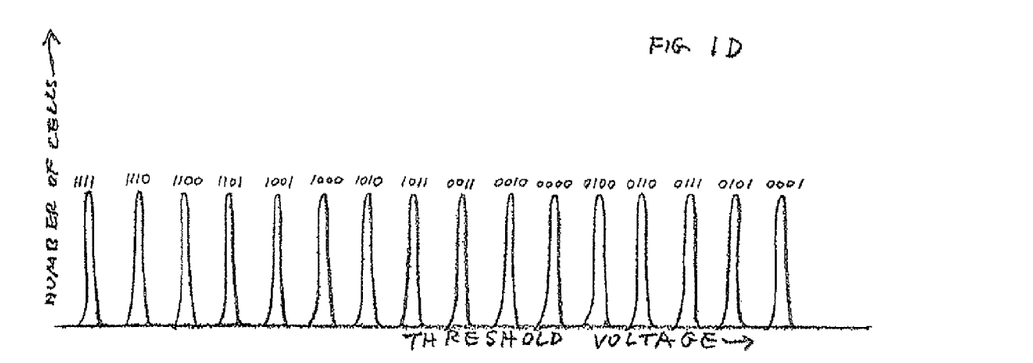

Similarly, in order for a single cell to store three bits of information the cell must be able to be in one of eight different states. So a 3-bit MBC cell should support eight different valid ranges for its threshold voltage. FIG. 1C shows the threshold voltage distribution for a typical 3-bit MBC cell. As expected, FIG. 1C has eight peaks, each corresponding to one state. FIG. 11) shows the threshold voltage distribution for a 4-bit MBC cell, for which sixteen states, represented by sixteen threshold voltage ranges, are required.

When encoding two bits in an MBC cell via the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are typically assigned by the following order from left to right: "10", "00", "01". One can see an example of an implementation of an MBC NAND flash memory using this encoding in U.S. Pat. No. 6,522,580 to Chen, which patent is incorporated by reference for all purposes as if fully set forth herein. See in particular FIG. 8 of the Chen patent. U.S. Pat. No. 6,643,188 to Tanaka also shows a similar implementation of an MBC NAND flash memory, but see FIG. 7 there for a different assignment of the states to bit encodings: "11", "10", "01", "00". The Chen encoding is the one illustrated in FIG. 1B.

We extend the above terminology and notation to the cases of more than two bits per cell, as follows. The left-most unwritten state represents "all ones" ("1 . . . 1"), the string "1 . . . 10" represents the case of only the lowest bit of the cell being written to "0", and the string "01 . . . 1" represents the case of only the most upper bit of the cell being written to "0".

When reading an MBC cell's content, the range that the cell's threshold voltage is in must be identified correctly; only in this case this cannot always be achieved by comparing to only one reference voltage. Instead, several comparisons may be necessary. For example, in the case illustrated in FIG. 1B, to read the lower bit, the cell's threshold voltage first is compared to a reference comparison voltage $V_1$ and then, depending on the outcome of the comparison, to either a zero reference comparison voltage or a reference comparison voltage $V_2$. Alternatively, the lower bit is read by unconditionally comparing the threshold voltage to both a zero reference voltage and a reference comparison voltage $V_2$, again requiring two comparisons. For more than two bits per cell, even more comparisons might be required.

The bits of a single MBC cell may all belong to the same flash page, or they may be assigned to different pages so that, for example in a 4-bit cell, the lowest bit is in page 0, the next bit is in page 1, the next bit in page 2, and the highest bit is in page 3. (A page is the smallest portion of data that can be separately written in a flash memory).

Lasser, U.S. patent application Ser. No. 11/035,807, deals with methods of encoding bits in flash memory cells storing multiple bits per cell. Lasser, U.S. pat. application Ser. No. 11/061,634, and Murin, U.S. patent application Ser. No. 11/078,478, deal with the implications of those methods of bits encoding on the question of error distribution across different logical pages of multi-bit flash cells. Specifically, Lasser '634 teaches a method for achieving even distribution of errors across different logical pages, as seen by the user of the data and as dealt with by the Error Correction Code (ECC) circuitry, using a logical-to-physical mapping of bit encodings; and Murin teaches a method for achieving even distribution of errors across different logical pages, as seen by the user of the data and as dealt with by the ECC circuitry, using interleaving of logical pages between physical bit pages. All three of these prior art patent applications are incorporated by reference for all purposes as if fully set forth herein.

Both Lasser '634 and Murin address the same goal: reducing the error rate for which the ECC circuitry should be designed. In the example presented in both applications a group of 15,000 4-bit MBC flash memory cells is used for storing 4 logical pages of data, of 15,000 bits each. The assumed cell error rate is 1 in 1,000. The resulting optimal number of bit errors is 15, and therefore the optimal average bit errors in a logical page is 3.75. The example shows that unless the proposed innovations are used, a specific logical page might end up with a much higher bit error rate—6 bit errors in the example shown. This means that even though the overall average of bit errors across all bits stored in the cells is relatively low (15 in 60,000, or 1 in 4,000), unless special measures are taken the ECC circuitry dealing with correcting errors in a logical page must be designed to handle a relatively high average bit error rate (in that example—6 in 15,000, or 1 in 2,500).

A recent US patent application by the inventors of the present application and entitled "METHOD OF ERROR CORRECTION IN MBC FLASH MEMORY" (herein "Litsyn et al.") discloses a different approach to the same goal. That patent application is incorporated by reference for all purposes as if fully set forth herein. Instead of dealing with each logical page separately for the purpose of error correction, Litsyn et al. deal with all logical pages sharing the same group of cells at the same time, treating all bits of all those multiple logical pages as one ECC codeword. This causes the average bit error rate which the ECC circuitry has to cope with to be lower—only 1 in 4,000 in the example above.

In most ECC implementations all bits are treated the same and no bits are considered more reliable or less reliable than the average. However, as is evident from the above, when reading multiple logical pages from a group of MBC flash memory cells, the bits stored in different bit pages have different error probabilities. Some of the prior art methods for averaging errors distribution discussed above (Lasser '634, Murin) succeed in causing all logical pages to have the same number of bit errors on average, but different individual bits still have different reliabilities.

Information about bit error rates of individual bits in a codeword that is to be error corrected is very useful for an error correction module. We shall demonstrate this using a very simplified example. Assume a group of four bits protected against a single error by a parity bit, such that if an error is detected the ECC selects one of the bits to be flipped and provides this as the correction result. If all five bits in the codeword (four data bits and one parity bit) are equally likely to be in error, then the decision as to which bit to flip upon detecting an error can only be made at random. This leads to only 20% correct decisions. But if one of the bits is known to be six times less reliable than any of the other four bits in the codeword, then selecting that bit to be flipped upon detecting an error results in 60% correct decisions. While this example is extremely simplified and in real-world FCC implementations the methods of calculation and decision taking are much more complicated, it does serve the purpose of demonstrating the usefulness of reliability data for individual bits for improving the performance of error correction schemes.

There are prior art systems in which extra reliability information affects the way FCC circuitry handles different bits. See for example U.S. patent application Ser. No. 10/867,645 to Ban et al. filed Jun. 16, 2004 and entitled "METHODS OF INCREASING THE RELIABILITY OF A FLASH MEMORY"—In Ban et al. the data stored in a flash cell are read using a higher resolution than is required for separating the state of a cell into its possible values. For example, if a cell is written into one of 16 states (i.e. the cell stores 4 bits), then the cell is read as if it had 5 bits. This is called using "fractional levels" by Ban et al. but others use different terms such as "soft bits". Others also use more than one bit of extra reading to provide even a higher resolution. The extra bits provided by that high resolution reading are used by the ECC module for estimating reliability of other "true" data bits, as they provide evidence regarding the exact state of a cell compared to the borders separating its state (as it was actually read) from the neighboring states. A cell located near a border is more likely to be in error than a cell located in the middle of the band and far away from the borders. There are also prior art communication systems that utilize this approach, where sometimes many extra high resolution bits are used for improving the error correction performance of a channel.

In all these prior art systems, the extra reliability information is information additional to information inherent in just the stored bits themselves. Such ECC would be simplified if it could be based only on what is inherent in the stored bits themselves. For example, ECC based on extra reliability information could be implemented without reading the cells of a MBC flash memory with more resolution than is needed to read the bits stored in the cells.

SUMMARY OF THE INVENTION

The scope of the present invention includes three methods of reading data stored in an MBC memory, with error correction, based on extra reliability information that is inherent to just the stored data. In the first method, the extra reliability information is explicitly a priori estimates of the reliabilities of the read bits. In the second method, the extra information is implicitly a priori estimates of the reliabilities of the read bits. In the third method, the reliability of at least some of the read bits is inferred from the values of the read bits.

The ECC of the present invention may be either systematic or non-systematic. In systematic ECC, the error correction takes the original data bits, appends to them some parity bits, and stores both the original data bits and the parity bits. Thus, the original data bits are preserved by the encoding process and can be identified among the stored bits. Later, when the stored bits are read, both the data bits and the parity bits are read, and the parity bits enable the correction of errors in the read data bits. In non-systematic ECC, the original data bits are not preserved and are not stored. Instead, the encoding process transforms the original data bits into a larger group of bits (herein called "protected bits") that are the bits actually stored. When the stored bits are read, the original bits are regenerated from the stored bits. There is no direct correspondence between a specific original data bit and a specific stored bit.

According to the present invention there is provided a method of reading a plurality of data bits that are stored in a memory that includes a plurality of multi-bit cells, the storing being effected by computing a plurality of parity bits that correspond to the data bits and then storing the data bits and the parity bits as stored bits in the cells of the memory, with a respective plurality of the stored bits being stored in each of the cells, the method including the steps of: (a) reading the cells, thereby obtaining, for each cell, a respective plurality of read bits; and (b) correcting the read bits that correspond to the data bits in accordance with the read bits that correspond to the parity bits, wherein the correcting is effected in accordance with a priori estimates of respective probabilities of at least two of the read bits being erroneous, wherein at least one estimate is different from at least one other estimate.

According to the present invention there is provided a computer-readable storage medium having computer-readable code embodied on the computer-readable storage medium, the computer-readable code for managing a memory that includes a plurality of multi-bit cells and wherein are stored a plurality of data bits, the data bits being stored by computing a plurality of parity bits that correspond to the data bits and then storing the data bits and the parity bits as stored bits in the cells of the memory, with a respective plurality of the stored bits being stored in each of the cells, the computer-readable code including: (a) program code for reading the cells, thereby obtaining, for each cell, a respective plurality of read bits; and (b) program code for correcting the read bits that correspond to the data bits in accordance with the read bits that correspond to the parity bits, wherein the correcting is effected in accordance with a priori estimates of respective probabilities of at least two of the read bits being erroneous, wherein at least one estimate is different from at least one other estimate.

According to the present invention there is provided a method of reading a plurality of data bits that are stored in a memory that includes a plurality of multi-bit cells, the storing being effected by computing a plurality of protected bits that correspond to the data bits and then storing the protected bits in the cells of the memory, with a respective plurality of the protected bits being stored in each of the cells, the method including the steps of: (a) reading the cells, thereby obtaining, for each cell, a respective plurality of read protected bits; and (b) recovering the data bits from the read protected bits, wherein the recovering is effected in accordance with a priori estimates of respective probabilities of at least two of the read protected bits being erroneous, wherein at least one estimate is different from at least one other estimate.

According to the present invention there is provided a computer-readable storage medium having computer-readable code embodied on the computer-readable storage medium, the computer-readable code for managing a memory that includes a plurality of multi-bit cells and wherein are stored a plurality of data bits, the data bits being stored by computing a plurality of protected bits that correspond to the data bits and then storing the protected bits in the cells of the memory, with a respective plurality of the protected bits being stored in each of the cells, the computer-readable code including: (a) program code for reading the cells, thereby obtaining, for each cell, a respective plurality of read bits; and (b) program code for recovering the data bits from the read protected bits, wherein the recovering is effected in accordance with a priori estimates of respective probabilities of at least two of the read protected bits being erroneous, wherein at least one estimate is different from at least one other estimate.

According to the present invention there is provided a method of reading a plurality of data bits that are stored in a memory that includes a plurality of multi-bit cells, the storing being effected by computing a plurality of parity bits that correspond to the data bits and then storing the data bits and the parity bits as stored bits in the cells of the memory, with a respective plurality of the stored bits being stored in each of the cells, the method including the steps of: (a) reading the cells, thereby obtaining, for each cell, a respective plurality of read bits; and (b) correcting the read bits that correspond to the data bits in accordance with the read bits that correspond to the parity bits, wherein the correcting is effected in accordance with respective probabilities, of at least two of the read bits being erroneous, that are based only on at least one aspect of the read bits, the at least one aspect including an aspect selected from the group consisting of respective significances of the read bits and respective bit pages of the read bits, wherein at least one probability is different from at least one other probability.

According to the present invention there is provided a computer-readable storage medium having computer-readable code embodied on the computer-readable storage medium, the computer-readable code for managing a memory that includes a plurality of multi-bit cells and wherein are stored a plurality of data bits, the data bits being stored by computing a plurality of parity bits that correspond to the data bits and then storing the data bits and the parity bits as stored bits in the cells of the memory, with a respective plurality of the stored bits being stored in each of the cells, the computer-readable code including: (a) program code for reading the cells, thereby obtaining, for each cell, a respective plurality of read bits; and (b) program code for correcting the read bits that correspond to the data bits in accordance with the read bits that correspond to the parity bits, wherein the correcting is effected in accordance with respective probabilities, of at least two of the read bits being erroneous, that are based only on at least one aspect of the read bits, the at least one aspect including an aspect selected from the group consisting of respective significances of the read bits and respective bit pages of the read bits, wherein at least one probability is different from at least one other probability.

According to the present invention there is provided a method of reading a plurality of data bits that are stored in a memory that includes a plurality of multi-bit cells, the storing being effected by computing a plurality of protected bits that correspond to the data bits and then storing the protected bits in the cells of the memory, with a respective plurality of the protected bits being stored in each of the cells, the method including the steps of: (a) reading the cells, thereby obtaining, for each cell, a respective plurality of read protected bits; and (b) recovering the data bits from the read protected bits, wherein the recovering is effected in accordance with respective probabilities, of at least two of the read protected bits being erroneous, that are based only on at least one aspect of the read protected bits, the at least one aspect including an aspect selected from the group consisting of respective significances of the read protected bits and respective bit pages of the read protected bits, wherein at least one probability is different from at least one other probability.

According to the present invention there is provided a computer-readable storage medium having computer-readable code embodied on the computer-readable storage medium, the computer-readable code for managing a memory that includes a plurality of multi-bit cells and wherein are stored a plurality of data bits, the data bits being stored by computing a plurality of protected bits that correspond to the data bits and then storing the protected bits in the cells of the memory, with a respective plurality of the protected bits being stored in each of the cells, the computer-readable code including: (a) program code for reading the cells, thereby obtaining, for each cell, a respective plurality of read bits; and (b) program code for recovering the data bits from the read protected bits, wherein the recovering is effected in accordance with respective probabilities, of at least two of the read protected bits being erroneous, that are based only on at least one aspect of the read protected bits, the at least one aspect including an aspect selected from the group consisting of respective significances of the read protected bits and respective bit pages of the read protected bits, wherein at least one probability is different from at least one other probability.

According to the present invention there is provided a method of reading a plurality of data bits that are stored in a memory that includes a plurality of multi-bit cells, the storing being effected by computing a plurality of parity bits that correspond to the data bits and then storing the data bits and the parity bits as stored bits in the cells of the memory, with a respective plurality of the stored bits being stored in each of the cells, the method including the steps of: (a) reading the cells, thereby obtaining, for each cell, a respective plurality of read bits; and (b) correcting the read bits that correspond to the data bits in accordance with the read bits that correspond to the parity bits, wherein the correcting is effected in accordance with respective probabilities, of at least two of the read bits being erroneous, that are based only on respective values of the read bits, wherein at least one probability is different from at least one other probability.

According to the present invention there is provided a computer-readable storage medium having computer-readable code embodied on the computer-readable storage medium, the computer-readable code for managing a memory that includes a plurality of multi-bit cells and wherein are stored a plurality of data bits, the data bits being stored by computing a plurality of parity bits that correspond to the data bits and then storing the data bits and the parity bits as stored bits in the cells of the memory, with a respective plurality of the stored bits being stored in each of the cells, the computer-readable code including: (a) program code for reading the cells, thereby obtaining, for each cell, a respective plurality of read bits; and (b) program code for correcting the read bits that correspond to the data bits in accordance with the read bits that correspond to the parity bits, wherein the correcting is effected in accordance with respective probabilities, of at least two of the read bits being erroneous, that are based only on respective values of the read bits, wherein at least one probability is different from at least one other probability.

According to the present invention there is provided a method of reading a plurality of data bits that are stored in a memory that includes a plurality of multi-bit cells, the storing being effected by computing a plurality of protected bits that correspond to the data bits and then storing the protected bits in the cells of the memory, with a respective plurality of the protected bits being stored in each of the cells, the method including the steps of: (a) reading the cells, thereby obtaining, for each cell, a respective plurality of read protected bits; and (b) recovering the data bits from the read protected bits, wherein the recovering is effected in accordance with respective probabilities, of at least two of the read protected bits being erroneous, that are based only on respective values of the read protected bits, wherein at least one probability is different from at least one other probability.

According to the present invention there is provided a computer-readable storage medium having computer-readable code embodied on the computer-readable storage medium, the computer-readable code for managing a memory that includes a plurality of multi-bit cells and wherein are stored a plurality of data bits, the data bits being stored by computing a plurality of protected bits that correspond to the data bits and then storing the protected bits in the cells of the memory, with a respective plurality of the protected bits being stored in each of the cells, the computer-readable code including: (a) program code for reading the cells, thereby obtaining, for each cell, a respective plurality of read protected bits; and (d) program code for recovering the data bits from the read protected bits, wherein the recovering is effected in accordance with respective probabilities, of at least two of the read protected bits being erroneous, that are based only on respective values of the read protected bits, wherein at least one probability is different from at least one other probability.

A first embodiment of the methods of the present invention is directed at correcting data stored in a MBC memory using systematic ECC. A second embodiment of the methods of the present invention is directed at correcting data stored in a MBC memory using non-systematic ECC. In both embodiments of both methods, the first step is reading the stored bits, thereby obtaining, for each cell in which relevant bits are stored, a respective plurality of "read" bits. Because of errors in reading the cells, a cell's "read" bits may not be identical to the bits that were stored in the cell. It is precisely this potential discrepancy between the read bits and the stored bits that ECC is intended to overcome.

In the first embodiment of the first method of the present invention, the read bits that correspond to the data bits are corrected according to the read bits that correspond to the parity bits. This correction takes into account a priori estimates of the probabilities that two or more of the read bits are erroneous, with not all the estimates being equal.

In the second embodiment of the first method of the present invention, the data bits are recovered from the read protected bits. This recovery takes into account a priori estimates of the probabilities that two or more of the read bits are erroneous, with not all the estimates being equal.

In the first embodiment of the second method of the present invention, the read bits that correspond to the data bits are corrected according to the read bits that correspond to the parity bits. This correction takes into account probabilities, that two or more of the read bits are erroneous, that are based only on at least one aspect of the read bits, with not all the probabilities being equal. The aspect(s) of the read bits that is/are used to estimate these probabilities must include either the significances of the read bits or the bit pages of the read bits or both.

In the second embodiment of the second method of the present invention, the data bits are recovered from read protected bits. This recovery takes into account probabilities, that two or more of the read protected bits are erroneous, that are based only on at least one aspect of the read protected bits, with not all the probabilities being equal. The aspect(s) of the read protected bits that is/are used to estimate these probabilities must include either the significances of the read bits or the bit pages of the read bits or both.

In the first embodiment of the third method of the present invention, the read bits that correspond to the data bits are corrected according to the read bits that correspond to the parity bits. This correction takes into account probabilities, that two or more of the read bits are erroneous, that are based only on the values of the read bits, with not all the probabilities being equal.

In the second embodiment of the third method of the present invention, the data bits are recovered from read protected bits. This recovery takes into account probabilities, that two or more of the read protected bits are erroneous, that are based only on the values of the read protected bits, with not all the probabilities being equal.

Preferably, in the first method of the present invention, at least two of the a priori estimates are for read bits, or for read protected bits, of a common one of the cells. Alternatively, at least two of the a priori estimates are for read bits, or for read protected bits, of different cells.

Preferably, in the first method of the present invention, the a priori probabilities depend on the significances of the relevant bits. The "significance" of a bit stored in a MBC cell is the position of the bit in the binary number that is stored in the MBC cell. For example, a MBC cell that stores four bits stores a binary number, between 0 and 15, that has four bits: a least significant bit, a next-to-leas significant bit, a next-to-most significant bit and a most significant bit. Alternatively, the a priori probabilities depend on the bit pages of the relevant bits. It is common practice in a MBC flash memory for all the bits of a common significance to be grouped in the same logical bit page(s), in which case these two dependencies of the a priori probabilities are equivalent.

The scope of the present invention also includes a controller, for a MBC memory, that recovers data stored in the memory using one of the methods of the present invention, a memory device that includes a MBC memory and a controller of the present invention, and a computer-readable storage medium having embodied thereon computer-readable code for managing a memory according to one of the methods of the present invention.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method of error correction, for a multi-bit-per-cell memory, that takes advantage of knowledge of probabilities of the various bits stored in each cell of being in error.

The principles and operation of error correction according to the present invention may be better understood with reference to the drawings and the accompanying description.

The first two methods of the present invention are improved methods for correcting errors in data read from an MBC flash memory device, utilizing reliability information derived from the locations in which individual bits are stored within the cells of the device (e.g., in the case of a MBC flash memory device in which the bits of each cell belong to different pages, in which bit pages the individual bits are stored). The third method of the present invention is an improved method for correcting errors in data read from an MBC flash memory device, using reliability information derived from correlation between different bits sharing a common cell. The proposed methods are applicable to cases in which the ECC codeword used in the correction process contains multiple bits that reside in a shared cell. This is always the case when the methods of Litsyn et al. are employed for correcting errors in data read from MBC flash devices.

In the first two methods of the present invention, advantage is taken of the fact that the physical storage location of each bit is known, and consequently its expected error rate is also known (note that the terms "error rate of a bit" and "reliability of a bit" are used here as two opposite aspects of the same feature, and therefore are used interchangeably for referring to the same characteristic). Consequently, the ECC module takes advantage of this information by assigning each bit an initial, a priori probability of error that serves as a starting point to the ECC calculations and decisions. The invention is not limited to any specific ECC scheme or algorithm—there are many ECC algorithms known in the prior art that can take advantage of such initial starting point and provide a better error correction in terms of probability of success, time to converge or other factors of success.

In particular, the first two methods of the present invention are intended for use with "soft" decoding algorithms. Such algorithms are described e.g. in George C. Clark, Jr. and J. Bibb Cain, *Error Correction Coding for Digital Communications* (Springer, 1981), in S. Lin and D. J. Costello, *Error Control Coding: Fundamentals and Applications* (Prentice-Hall, 1983) and in Branka Vucetic and Jinhong Yuan, Turbo Codes: Principles and Applications (Kluwer, 2000). Although these references are directed at the use of soft ECC algorithms in communications, it will be clear to those skilled in the art how to adapt those algorithms to error correction in multi-bit-per-cell memories.

These methods differ from the prior art methods mentioned above in which extra information is derived from reading the cells with higher resolution. In the present invention the different reliability values are determined prior to reading the data and are not dependent on the actual values of the data read. This is not the case in the above prior art methods. In other words, the present invention is capable of using a-priori probabilities of error for individual bit positions, even if such probabilities cannot be derived from the actual data, while prior art systems are dependent upon the ability to extract such probabilities from the actual data. The present invention makes use of probabilities that can be supplied, for example, by the vendor of the flash. One advantage of this a priori probability is that the present invention is simpler to implement than the prior art methods. Unlike those methods, the present invention does not need to extract and manipulate additional bits on top of the stored bits.

For example, consider the four-bit-per-cell bit ordering $\{15,14,12,13,9,8,10,11,3,2,0,4,6,7,5,1\}$ that is discussed in Lasser '634 and in Murin. (This is the bit ordering that is illustrated in FIG. 1D). As shown in those patent applications, the lowest-order bit is six times as likely as the highest-order bit to be in error, the second-lowest-order bit is five times as likely as the highest-order bit to be in error, and the second-highest-order bit is three times as likely as the highest-order bit to be in error. In a group of 15,000 four-bit-per-cell MBC cells that is used to store four logical pages of data, with an assumed cell error rate of 1 in 1,000, the lowest-order bit of each cell has an a priori error probability of $6/15,000=2/5$, 000, the second-lowest-order bit of each cell has an a priori error probability of 5/15,000=1/3,000, the second-highest-order bit of each cell has an a priori error probability of 3/15,000=1/5,000 and the highest-order bit of each cell has an a priori error probability of 1/15,000.

In this example, the a priori error probabilities of the bits are functions only of the significances of the bits. All the bits in the same bit page have the same a priori probability of being in error. More generally, it is possible for some bits of a bit page to have different a priori error probabilities than other bits of the same bit page.

In the third method of the present invention, advantage is taken of the fact that in addition to reliability information derived from a bit's location in the physical page bits of MBC cells, there is another source of information that may be utilized by an ECC module. Contrary to the case where each bit of an ECC codeword originates from a different cell, where there is no correlation between the errors of different bits, in the case there are in the codeword multiple bits originating from the same cell (as is the case in the method of Litsyn et al.), we may deduce from the value of one bit about values of other bits in the same cell. As not all erroneous state transitions in a flash cell are equally probable, deductions can be made from one bit to another.

Consider, for example, the four-bit-per-cell bit ordering $\{15,14,12,13,9,8,10,11,3,2,0,4,6,7,5,1\}$. Suppose that the decoding of the cells is done sequential, from the most significant bit to the least significant bit. Suppose that the three most significant bits of a cell have been read as "100" and have been corrected to "101" by the ECC algorithm. The only way that this could have happened with a shift of only one threshold voltage range is if the cell was written as 10 (binary 1010) and read as 8 (binary 1000). The alternatives are:

The cell was written as 10 (binary 1010) and read as 9 (binary 1001), a shift of two threshold voltage ranges.
The cell was written as 11 (binary 1011) and read as 8 binary 1000), a shift of two threshold voltage ranges.
The cell was written as 11 (binary 1011) and read as 9 (binary 1001), a shift of three threshold voltage ranges.

This implies that the odds of the least significant bit being "0" are much higher than the odds of the least significant bit being "1".

This method also differs from the prior art methods mentioned above in which extra information is derived from reading the cells with higher resolution. In the present invention the only bits that are input into the ECC module are the data bits and their corresponding parity bits. No other data-dependent inputs (in contrast to predetermined non-data-dependent inputs) is provided to the ECC module for performing its correction process. This is not the case in the above prior art methods, where extra bits of higher precision are generated from the cells and provided to the ECC module as auxiliary inputs.

The scope of the present invention also includes the more general case in which only some but not all of the bits in the codeword are assigned initial probabilities that are different from the average. It also includes the more general case in which the correlation effects between bits sharing cells are only taken into account for some but not all of the cells.

So far, the present invention has been presented in the context of error correction schemes that are "systematic". As noted above, in systematic error correction coding, the original data bits are preserved by the encoding process and can be identified within the bits stored. In other words, the error correction mechanism takes the original data bits, adds to them some parity bits, and stores both data bits and parity bits. Later, when reading the stored bits, both the data bits and the parity bits are read, and the parity bits enable the correction of errors in the read data bits, thus generating the original data bits.

However, the present invention is equally applicable to non-systematic error correction codes. As noted above, in such codes the original data bits are not preserved and are not stored. Instead, the encoding process transforms the original data bits into a larger group of bits that are the bits actually stored. When reading the stored protected data bits the original data bits are re-generated, even if there are errors in the protected data bits. The defining characteristic of non-systematic codes is that there is no direct correspondence between a specific original data bit and a specific stored bit. An original data bit is "scattered" in multiple stored bits, and only the combination of those multiple stored bits tells the value of the original bit.

The scope of the present invention includes methods for reading data bits from an MBC flash memory device, as described above. The scope of the present invention also includes a flash memory controller that reads from an array of MBC flash memory cells according to the above methods. The scope of the invention also includes a flash memory device that combines an array of MBC flash memory cells with a flash memory controller that reads from the array according to the above methods.

Figure 2:
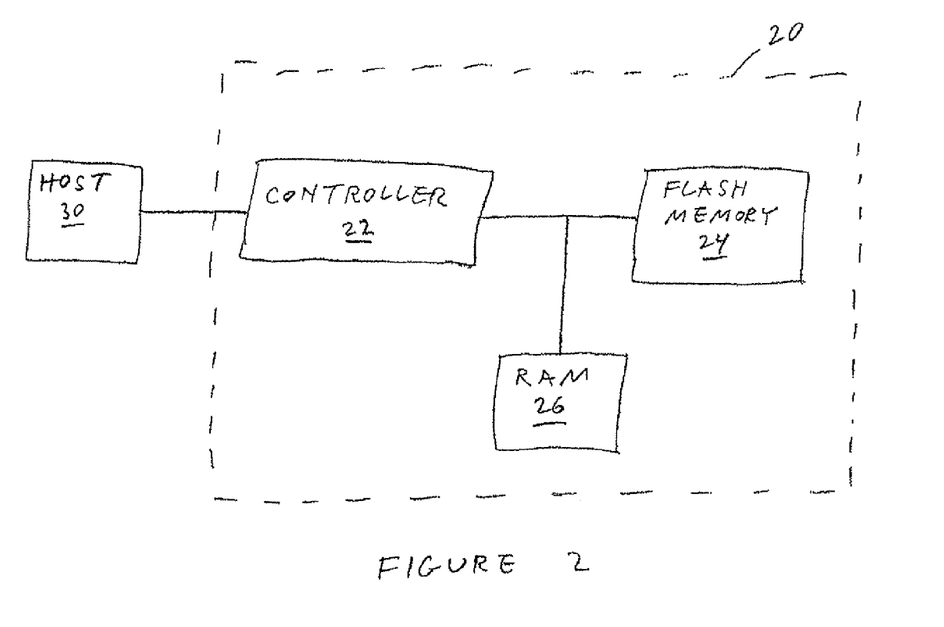
FIG. 2 is a high-level block diagram of a flash memory device of the present invention.

Referring again to the drawings, FIG. 2 is a high-level block diagram of a flash memory device 20 of the present invention, coupled to a host 30. FIG. 2 is adapted from FIG. 1 of Ban, U.S. Pat. No. 5,404,485, which patent is incorporated by reference for all purposes as if fully set forth herein. Flash memory device 20 includes a flash memory 24, a controller 22 and a random access memory (RAM) 26. Controller 22, that corresponds to "flash control 14" of U.S. Pat. No. 5,404,485, manages flash memory 24, with the help of RAM 26, as described in U.S. Pat. No. 5,404,485. Flash memory 24 encodes data, two or more bits per cell of flash memory 24, as described in U.S. Pat. No. 6,522,580 or in U.S. Pat. No. 6,643,188. When reading the data, controller 22 applies error correction as described above.

Figure 3:
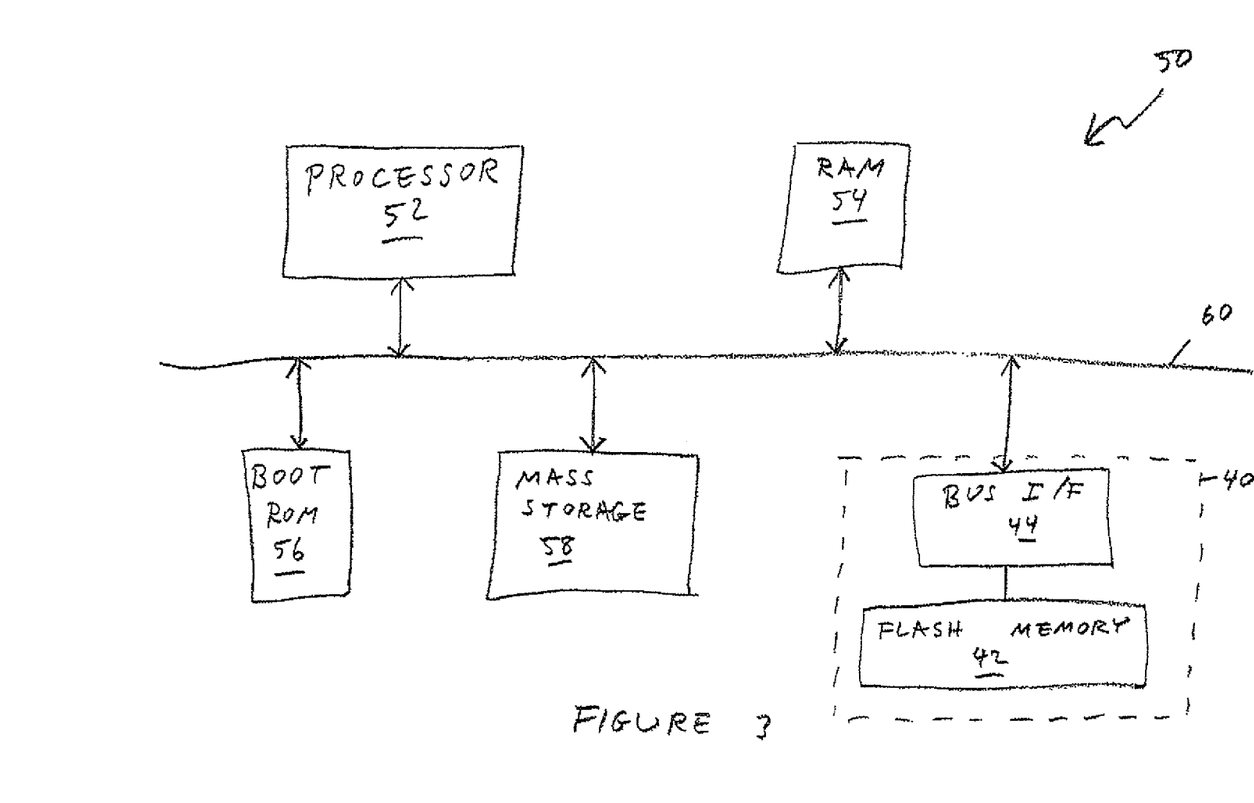
FIG. 3 is a high-level partial block diagram of a data storage system of the present invention.

FIG. 3 is a high-level partial block diagram of an alternative data storage system 50 of the present invention. Data storage system 50 includes a processor 52 and four memory devices: a RAM 54, a boot ROM 56, a mass storage device (hard disk) 58 and a flash memory device 40, all communicating via a common bus 60. Like flash memory device 20, flash memory device 40 includes a flash memory 42. Unlike flash memory device 20, flash memory device 40 lacks its own controller and RAM. Instead, processor 52 emulates controller 22 by executing a software driver that implements the methodology of U.S. Pat. No. 5,404,485 in the manner, e.g. of the TrueFFS™ driver of M-Systems Flash Disk Pioneers Ltd. of Kfar Saba, Israel. Flash memory 42 encodes data, two or more bits per cell of flash memory 42, as described in U.S. Pat. No. 6,522,580 or in U.S. Pat. No. 6,643,188. When reading the data, processor 52 applies error correction as described above. Flash memory device 40 also includes a bus interface 44 to enable processor 52 to communicate with flash memory 42.

The code of the software driver that processor 52 executes to manage flash memory 42 is stored in mass storage device 58 and is transferred to RAM 54 for execution. Mass storage device 58 thus is an example of a computer-readable code storage medium in which is embedded computer readable code for managing flash memory 42 according to the principles of the present invention.

While the invention has been described with respect to a limited number of embodiments, it will be appreciated that many variations, modifications and other applications of the invention may be made.

The invention claimed is:

1. A method of reading a plurality of data bits that are stored in a memory that includes a plurality of multi-bit cells, the storing being effected by computing a plurality of parity bits that correspond to the data bits and then storing the data bits and the parity bits as stored bits in the cells of the memory, with a respective plurality of the stored bits being stored in each of the cells, the method comprising the steps of:
   (a) reading the cells, thereby obtaining, for each cell, a respective plurality of read bits; and
   (b) correcting said read bits that correspond to the data bits in accordance with said read bits that correspond to the parity bits, wherein said correcting is effected in accordance with respective probabilities, of at least two of said read bits being erroneous, that are based at least in part on information obtained as a result of said reading, said information being confined to respective values of said read bits, wherein at least one said probability is different from at least one other said probability, wherein a respective probability of a bit read from a cell being erroneous depends solely on read values of one or more further bits read from the same cell, and wherein the respective probability is derived based on a number of threshold voltage shifts between the read values and one or more possible alternative values.

2. A computer-readable storage medium having computer-readable code embodied on the computer-readable storage medium, the computer-readable code for managing a memory that includes a plurality of multi-bit cells and wherein are stored a plurality of data bits, the data bits being stored by computing a plurality of parity bits that correspond to the data bits and then storing the data bits and the parity bits as stored bits in the cells of the memory, with a respective plurality of the stored bits being stored in each of the cells, the computer-readable code comprising:
   (a) program code for reading the cells, thereby obtaining, for each cell, a respective plurality of read bits; and
   (b) program code for correcting said read bits that correspond to the data bits in accordance with said read bits that correspond to the parity bits, wherein said correcting is effected in accordance with respective probabilities, of at least two of said read bits being erroneous, that are based at least in part on information obtained as a result of said reading, said information being confined to respective values of said read bits, wherein at least one said probability is different from at least one other said probability, wherein a respective probability of a bit read from a cell being erroneous depends solely on read values of one or more further bits read from the same cell, and wherein the respective probability is derived based on a number of threshold voltage shifts between the read values and one or more possible alternative values.

3. A method of reading a plurality of data bits that are stored in a memory that includes a plurality of multi-bit cells, the storing being effected by computing a plurality of protected bits that correspond to the data bits and then storing the protected bits in the cells of the memory, with a respective plurality of the protected bits being stored in each of the cells, the method comprising the steps of:
   (a) reading the cells, thereby obtaining, for each cell, a respective plurality of read protected bits; and
   (b) recovering the data bits from the read protected bits, wherein said recovering is effected in accordance with respective probabilities, of at least two of said read protected bits being erroneous, that are based at least in part on information obtained as a result of said reading, said information being confined to respective values of said read protected bits, wherein at least one said probability is different from at least one other said probability, wherein a respective probability of a protected bit read from a cell being erroneous depends solely on read values of one or more further protected bits read from the same cell, and wherein the respective probability is derived based on a number of threshold voltage shifts between the read values and one or more possible alternative values.

4. A computer-readable storage medium having computer-readable code embodied on the computer-readable storage medium, the computer-readable code for managing a memory that includes a plurality of multi-bit cells and wherein are stored a plurality of data bits, the data bits being stored by computing a plurality of protected bits that correspond to the data bits and then storing the protected bits in the cells of the memory, with a respective plurality of the protected bits being stored in each of the cells, the computer-readable code comprising:
   (a) program code for reading the cells, thereby obtaining, for each cell, a respective plurality of read protected bits; and
   (b) program code for recovering the data bits from said read protected bits, wherein said recovering is effected in accordance with respective probabilities, of at least two of said read protected bits being erroneous, that are based at least in part on information obtained as a result of said reading, said information being confined to respective values of said read protected bits, wherein at least one said probability is different from at least one other said probability, wherein a respective probability of a protected bit read from a cell being erroneous depends solely on read values of one or more further protected bits read from the same cell, and wherein the respective probability is derived based on a number of threshold voltage shifts between the read values and one or more possible alternative values.

5. An apparatus comprising a memory, the memory comprising plurality of memory cells, wherein the apparatus is configured to read a plurality of data bits stored on the memory, the storing being effected by computing a plurality of parity bits that correspond to the data bits and then storing the data bits and the parity bits as stored bits in the cells of the memory, with a respective plurality of the stored bits being stored in each of the cells, by at least:
   (a) reading the cells, thereby obtaining, for each cell, a respective plurality of read bits; and
   (b) correcting said read bits that correspond to the data bits in accordance with said read bits that correspond to the parity bits, wherein said correcting is effected in accordance with respective probabilities, of at least two of said read bits being erroneous, that are based at least in part on information obtained as a result of said reading, said information being confined to respective values of said read bits, wherein at least one said probability is different from at least one other said probability, wherein a respective probability of a bit read from a cell being erroneous depends solely on read values of one or more further bits read from the same cell, and wherein the respective probability is derived based on a number of threshold voltage shifts between the read values and one or more possible alternative values.

6. The apparatus of claim 5, wherein the apparatus further comprises a controller and wherein the controller is configured to read the plurality of data bits stored on the memory.

* * * * *